(12) United States Patent
Pasqualini (10) Patent No.: US 7,518,419 B1
(45) Date of Patent: Apr. 14, 2009

(54) WIDEBAND POWER-ON RESET CIRCUIT

(75) Inventor: Ronald Pasqualini, Los Altos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 7 days.

(21) Appl. No.: 11/639,497

(22) Filed: Dec. 15, 2006

(51) Int. Cl.
*H03L 7/00* (2006.01)

(52) U.S. Cl. ............... 327/143; 327/142; 327/198

(58) Field of Classification Search ............... 327/142, 327/143, 198, 199–203, 208–212, 214, 218
See application file for complete search history.

(56) References Cited

U.S. PATENT DOCUMENTS

| | | | |
|---|---|---|---|
| 4,716,322 A | 12/1987 | D'Arrigo et al. ............ 307/592 |
| 4,788,454 A | 11/1988 | Tanagawa et al. ....... 307/296 R |
| 4,900,950 A | 2/1990 | Dubujet ................... 307/272.3 |
| 4,939,385 A | 7/1990 | Dubujet ................... 307/296.8 |
| 5,103,115 A | 4/1992 | Ueda et al. ............... 307/272.3 |
| 5,109,163 A | 4/1992 | Benhamida ............... 307/272.3 |
| 5,321,317 A | 6/1994 | Pascucci et al. .......... 307/296.4 |
| 5,369,310 A | 11/1994 | Badyal et al. ............... 327/143 |
| 5,396,115 A | 3/1995 | Coffman et al. ............ 327/143 |
| 5,446,404 A | 8/1995 | Badyal et al. ............... 327/143 |
| 5,485,111 A | 1/1996 | Tanimoto ................... 327/143 |
| 5,744,990 A | 4/1998 | Burstein et al. ............ 327/143 |
| 5,767,710 A | 6/1998 | Cho ........................... 327/143 |
| 5,828,251 A | 10/1998 | Freyman et al. ............ 327/143 |
| 5,847,586 A | 12/1998 | Burstein et al. ............ 327/143 |
| 5,881,113 A * | 3/1999 | Lee ........................... 375/354 |
| 5,933,036 A | 8/1999 | Kim .......................... 327/143 |
| 6,005,423 A | 12/1999 | Schultz ...................... 327/143 |
| 6,052,006 A | 4/2000 | Talaga, Jr. et al. .......... 327/143 |
| 6,144,238 A | 11/2000 | Dasgupta ................... 327/143 |
| 6,160,428 A | 12/2000 | Pasqualini ................. 327/142 |

(Continued)

OTHER PUBLICATIONS

Wikipedia—Counter http://en.wikipedia.org/wiki/Counter.*
Takeo Yasuda et al., "A Power-On Reset Pulse Generator For Low Voltage Applications", IEEE, 2001, pp. IV-598 thru IV-601.
Sanjay Kumar Wadhwa, "Zero Steady State Current Power-On-Reset Circuit with Brown-Out Detector", Proceedings of the 19th International Conference on VLSI Design (VLSID '06) IEEE, 2006, pp. 631-636.
Lai Xinquan, et al., "A Low Quiescent Current And Reset Time Adjustable Power-On Reset Circuit", Institute of Electronic CAD, IEEE, 2005, pp. 568-571.
W.C. Yen and H.W. Chen, Low Power and Fast System Wakeup Circuit, IEE Proc.-Circuits Devices Syst., vol. 152, No. 3, Jun. 2005, pp. 223-228.

*Primary Examiner*—Long Nguyen
*Assistant Examiner*—Brandon S Cole
(74) *Attorney, Agent, or Firm*—Mark C. Pickering (57) ABSTRACT

A power-on reset circuit includes a trigger circuit that indicates when a power supply has been turned on, and when the supply has reached a voltage level that is sufficient for normal chip operation. For chips that contain a crystal oscillator, the power-on reset circuit also includes logic that determines the duration of the crystal warm-up delay.

14 Claims, 5 Drawing Sheets

U.S. PATENT DOCUMENTS

| | | | |
|---|---|---|---|
| 6,204,701 B1 | 3/2001 | Tsay et al. | 327/143 |
| 6,246,272 B1 | 6/2001 | Takai | 327/143 |
| 6,346,834 B1 | 2/2002 | Chai | 327/143 |
| 6,377,090 B1 | 4/2002 | Bruno | 327/143 |
| 6,744,291 B2 * | 6/2004 | Payne et al. | 327/143 |
| 6,801,060 B2 | 10/2004 | Ikehashi et al. | 327/80 |
| 6,873,192 B2 * | 3/2005 | Kang et al. | 327/143 |
| 6,943,596 B2 | 9/2005 | Slamowitz et al. | 327/143 |
| 7,019,417 B2 | 3/2006 | Kang | 307/113 |
| 7,030,681 B2 | 4/2006 | Yamazaki et al. | 327/534 |
| 7,057,427 B2 | 6/2006 | Wadhwa et al. | 327/143 |
| 2006/0044028 A1 * | 3/2006 | Bhattacharya et al. | 327/143 |

* cited by examiner

WIDEBAND POWER-ON RESET CIRCUIT

BACKGROUND OF THE INVENTION

1. Field of the Invention

The present invention relates to power-on reset circuits and, more particularly, to a wideband power-on reset circuit that can function over a wide range of supply voltages and supply voltage rise times.

2. Description of the Related Art

When a DC power supply is initially switched on, its output voltage rises and ultimately stabilizes at a specified DC value. The time interval from when the power supply is initially switched on, to when its output voltage finally stabilizes, is often referred to as the "power-on reset interval" or the "cold initialization interval".

All on-chip circuits that are connected to the power supply must be forced into their correctly initialized states during cold initialization. If the on-chip circuits are not properly initialized, the circuits could generate false output signals during initialization, or enter the wrong initialized state. Both of these possibilities can cause erratic system behavior and/or system failure.

For chips that derive their DC (VDD) supply voltage from an AC line, the cold initialization interval cannot be less than 4 ms (¼ cycle of the 60 cycle AC line). However, in most cases the cold initialization interval can last considerably longer than this, depending on the rise time specifications of the power supply. Alternatively, for chips that are directly powered from a battery, the cold initialization interval can be extremely short, on the order of a few microseconds.

If the system includes a crystal oscillator, the cold initialization interval must be extended to include a crystal warm-up delay. This warm-up delay must provide sufficient time for the crystal to begin oscillating at the desired frequency, with the desired accuracy. For most crystals, the required warm-up delay is relatively long, on the order of 25 ms to 250 ms.

The cold initialization interval is typically generated by a power-on reset circuit. Ideally, the power-on reset circuit is a completely on-chip circuit that does not require any package pins or external components, such as a resistor and/or a capacitor. However, when the cold initialization interval must be extended to include a crystal warm-up delay, it is not practical to employ an on-chip RC time constant in order to generate the required warm-up delay.

For example, assuming that the maximum practical value of an on-chip capacitor is 100 pF, a 2500 MΩ resistor would be required in order to generate a 250 ms time delay. However, it is not practical to implement a 2500 MΩ resistor on-chip for two reasons: 1) the chip area consumed would be extremely large, and 2) the resistor current would not be reliable because it would be extremely small (i.e. on the order of 1 nA at 3.3V).

In summary, if the cold initialization interval includes a crystal warm-up delay, a power-on reset circuit cannot use on-chip RC components to generate the crystal warm-up delay. This implies that the power-on reset circuit must be "ratiometric" to the VDD voltage. In other words, the output of the power-on reset circuit must only depend upon the value of the VDD voltage, not upon the ramp rate of the VDD voltage.

Furthermore, a "valid" (sufficiently high) VDD voltage is not available during most of the cold initialization interval because the VDD voltage is ramping up during this interval. As a result, a power-on reset circuit must be able to operate correctly, even when a "valid" VDD voltage is not present.

Due to the limitations described above, there is a need for an on-chip power-on reset circuit that can generate a crystal warm-up delay without requiring any external components or package pins. Furthermore, the power-on reset circuit must not depend upon the VDD voltage ramp rate or the presence of a valid VDD voltage during most of the cold initialization interval.

DETAILED DESCRIPTION OF THE INVENTION

Figure 1:
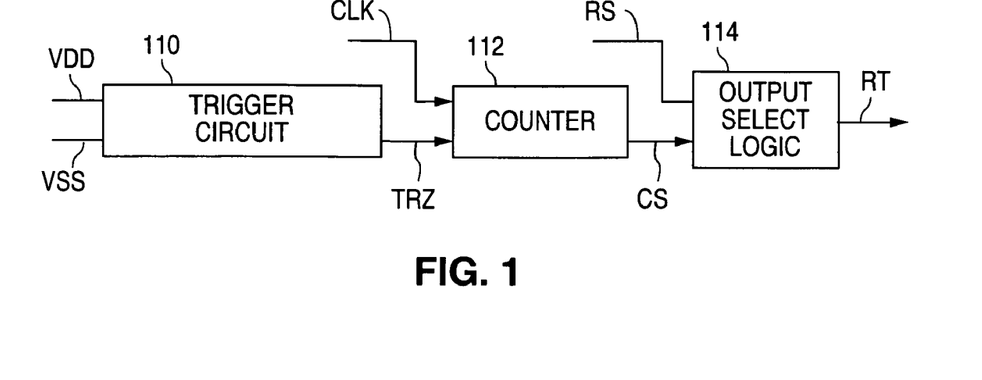
FIG. 1 is a block diagram illustrating an example of a power-on reset circuit 100 in accordance with the present invention.

FIG. 1 shows a block diagram that illustrates an example of a power-on reset circuit 100 in accordance with the present invention. As described in greater detail below, the power-on reset circuit of the present invention utilizes a trigger circuit to indicate when a valid VDD voltage level has been reached, after a power supply has been turned on. In addition, the power-on reset circuit also utilizes a counter that indicates when a crystal warm-up delay has expired, after a valid VDD voltage level has been reached.

As shown in FIG. 1, power-on reset circuit 100 includes a trigger circuit 110 that generates an output trigger signal TRZ (active low in this example), in response to a rising power supply voltage VDD. In addition, power-on reset circuit 100 also includes a counter 112 that counts the pulses of a clock input signal CLK, to generate a crystal warm-up delay.

As further shown in FIG. 1, power-on reset circuit 100 also includes an output select logic circuit 114 that receives the counter output signal CS and a read input signal RS. In addition, output select logic circuit 114 also generates an active high reset signal RT, in response to the counter output signal CS and the read input signal RS.

In operation, the active low trigger signal TRZ is initially low, and will continue to remain low, until the VDD power supply voltage level has become sufficiently high. Thus trigger circuit 110 will remove the active low trigger signal TRZ after the VDD voltage has been initially switched on, and after the VDD voltage level has reached a sufficiently high value. This sufficiently high value must be high enough so that all of the on-chip flipflops and logic gates can operate properly, under all circuit conditions. However, if this sufficiently high voltage value is too high (i.e. greater than the minimum steady-state value of VDD), the active low trigger signal TRZ will permanently remain low. This causes the chip to permanently remain in the reset state, resulting in a serious malfunction.

In addition, while the active low trigger signal TRZ remains low, counter 112 is continually cleared to the starting value (usually zero) in its count range. Counting begins when the active low trigger signal TRZ is removed (i.e. when TRZ goes from 0 volts to the rising VDD value that is currently present). Counting ends when counter 112 reaches its terminal count value. When this occurs, the counter output signal CS will change state, usually from low to high, depending upon the counter implementation.

For example, counter 112 can be implemented as a conventional 24-bit ripple counter, whose last stage output will change state, from low to high, after $2^{23}$ pulses (8,388,608 pulses) have been counted. When this occurs, the counter output signal CS will go from low to high.

As described above, counter 112 will change the logic state of the counter output signal CS, after the crystal warm-up delay (cold initialization interval) has expired. For example, if the frequency of the clock signal CLK is 25 Mhz, and the ripple counter length is 24 bits, then the crystal warm-up delay will be equal to $2^{23}/25$ Mhz=0.336 seconds.

Figure 2:
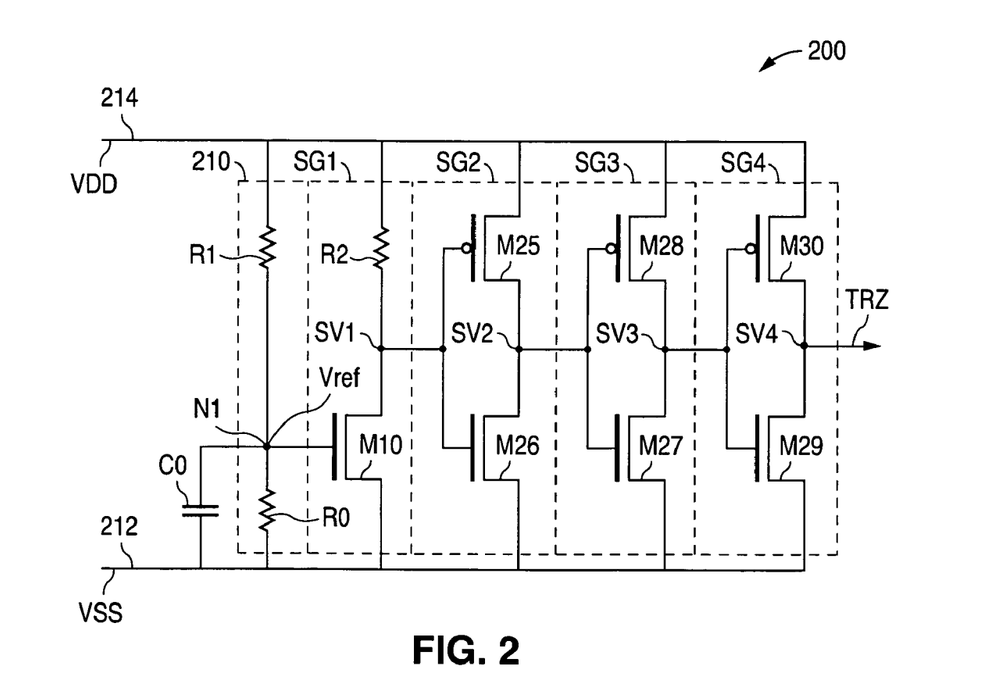
FIG. 2 is a schematic diagram illustrating an example of a trigger circuit 200 in accordance with the present invention.

FIG. 2 shows a schematic diagram that illustrates an example of a trigger circuit 200 in accordance with the present invention. Trigger circuit 200 can be used to implement trigger circuit 110. As shown in FIG. 2, trigger circuit 200 includes a voltage divider 210 and four inverter stages SG1-SG4.

In the FIG. 2 example, voltage divider 210 is implemented as a resistor voltage divider that includes a first resistor R0 which is connected to a ground line 212 and an intermediate node N1, and a second resistor R1 which is connected to a power supply line 214 and the intermediate node N1. In addition, voltage divider 210 outputs a reference voltage Vref on the intermediate node N1. The value of the reference voltage Vref is defined by the values of the first and second resistors R0 and R1, and the VDD voltage level.

Referring to FIG. 2, as the VDD voltage on power supply line 214 rises from 0V towards its final DC value, the Vref reference voltage will also increase, according to the R0/R1 resistor ratio. Furthermore, as the VDD voltage rises, the Vref reference voltage will immediately respond, even when the VDD voltage is very close to 0V. This allows trigger circuit 200 to respond well, even for VDD operating voltages that are extremely low.

In the FIG. 2 example, the first inverter stage SG1 is implemented with an NMOS transistor M10 and a load resistor R2. NMOS transistor M10 has a source connected to ground line 212, a gate connected to receive the reference voltage Vref, and a drain. Load resistor R2, in turn, is connected to power supply line 214 and the drain of transistor M10. In addition, first inverter stage SG1 outputs a first stage output voltage SV1 from the drain of transistor M10.

Referring to FIG. 2, NMOS transistor M10 and load resistor R2 function as a voltage comparator that generates the first stage output voltage SV1. The SV1 voltage output by this comparator depends upon the instantaneous value of the changing VDD voltage, the magnitude of the Vref reference voltage output by voltage divider 210, and the threshold voltage of NMOS transistor M10.

Figure 3:
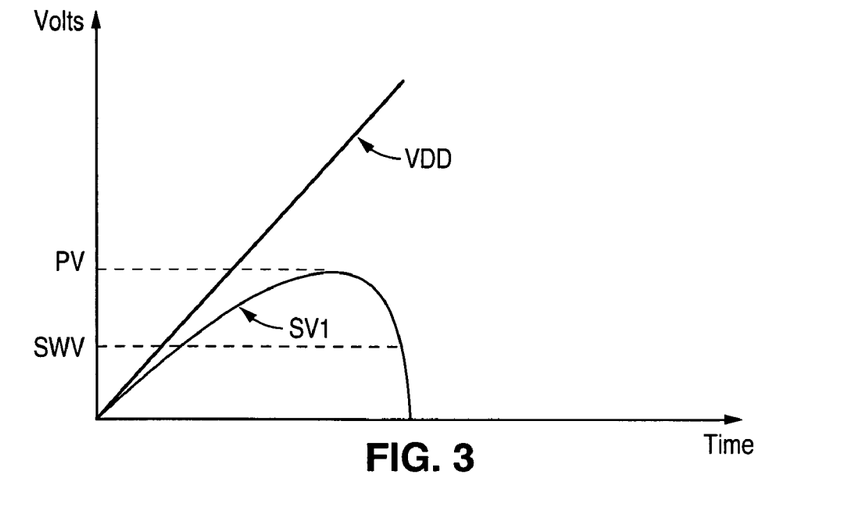
FIG. 3 is a timing diagram illustrating an example of the operation of first inverter stage SG1 in trigger circuit 200 in accordance with the present invention.

In accordance with the present invention, FIG. 3 shows a timing diagram that illustrates an example of the SV1 output voltage versus time, for the first inverter stage SG1 of trigger circuit 200. FIGS. 4A-4D also show timing diagrams that illustrate examples of the low-frequency time response of trigger circuit 200, in accordance with the present invention.

As discussed above, for chips that are powered from the AC line (non-battery applications), the fastest possible rise time of the VDD voltage is approximately 4 ms (for a 60 cycle AC line). However, since the time constants of trigger circuit 200 are much faster than 4 ms, trigger circuit 200 effectively responds to changes in the VDD voltage "instantaneously". As a result, a DC transfer function analysis can be used to analyze the response of trigger circuit 200, from the fastest possible VDD rise time (4 ms), down to the slowest possible VDD rise time (very slow, or approximately DC).

Figure 4A:
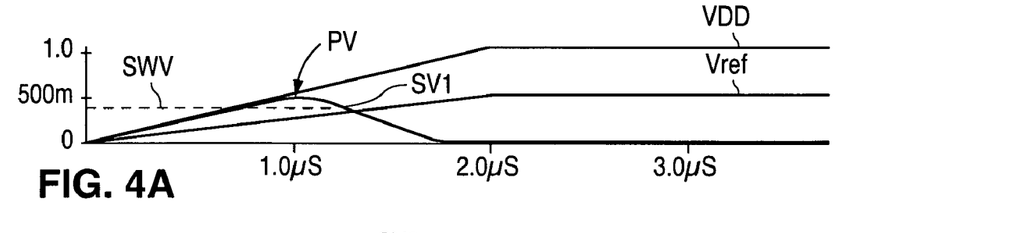
FIGS. 4A-4D are timing diagrams illustrating examples of the low-frequency time response of trigger circuit 200 in accordance with the present invention.

As illustrated in FIGS. 3 and 4A, the VDD voltage rises linearly from 0V to its final DC value (1V in FIG. 4A) in 2 us. Thus, since the reference voltage Vref is a linear function (constant percentage) of the rising VDD voltage, Vref will also rise linearly from 0V to its final DC value in 2 us.

In addition, because transistor M10 is initially turned off, the first stage output voltage SV1 will initially rise linearly, as the VDD voltage rises linearly. However, when the Vref reference voltage reaches the threshold voltage of NMOS transistor M10 (after approximately 0.8 us in FIG. 4A), current will begin to flow through transistor M10. Once this current begins to flow, the magnitude of the first stage output voltage SV1 is defined by the relative resistances of transistor M10 and the load resistor R2. At this point, transistor M10 is functioning in its linear region of operation, and essentially behaves as a resistor.

Thus, after transistor M10 has turned on, the first stage output voltage SV1 is defined by the M10/R2 resistor ratio. However, as VDD continues to rise, the resistance provided by transistor M10 does not remain constant. Instead, this resistance decreases over time, as the reference voltage Vref on the gate of transistor M10 continues to increase. Eventually, as VDD approaches its final DC value, transistor M10 will provide very low resistance. Thus, when transistor M10 provides very low resistance, substantially all of the VDD voltage is dropped across load resistor R2. This, in turn, causes the magnitude of the first stage output voltage SV1 to fall close to 0V, as shown in FIG. 4A.

Thus, as shown in FIGS. 3 and 4A, as the VDD voltage on power supply line 214 increases from 0V, the first stage output voltage SV1 will also increase from 0V, until it reaches a peak voltage PV (at approximately 1.0 uS in FIG. 4A). Furthermore, as the VDD voltage continues to increase, the first stage output voltage SV1 will then begin to decrease, eventually returning close to 0V (at approximately 2.0 us in FIG. 4A). The net result is that a parabolic-like waveform is generated at the first stage output SV1.

The shape of the SV1 curve shown in FIG. 4A, including the location of the peak voltage PV, depends upon the values of resistors R0, R1, and R2, and the size and threshold voltage of transistor M10. For example, increasing the value of resistor R0 lowers the peak voltage PV, and decreasing the value of resistor R0 increases the peak voltage PV. Similarly, decreasing the value of resistor R1 lowers the peak voltage PV, and increasing the value of resistor R1 increases the peak voltage PV.

Referring to FIG. 2, the second inverter stage SG2 is implemented with a PMOS transistor M25 and an NMOS transistor M26. PMOS transistor M25 has a source connected to the power supply line 214, a gate connected to receive the first stage output voltage SV1, and a drain. NMOS transistor M26 has a source connected to ground line 212, a gate connected to the gate of PMOS transistor M25 to receive the first stage output voltage SV1, and a drain connected to the drain of PMOS transistor M25. In addition, second inverter stage SG2 generates a second stage output voltage SV2 from the drains of PMOS transistor M25 and NMOS transistor M26.

By varying the ratio of widths for PMOS transistor M25 and NMOS transistor M26, the switching threshold voltage (SWV) of second inverter stage SG2 can be adjusted to lie below the peak output voltage (PV) of first inverter stage SG1. Thus, before the first stage output voltage SV1 reaches the second stage switching threshold voltage SWV, transistor M25 is essentially turned off and transistor M26 is essentially turned on. As a result, second inverter stage SG2 initially outputs a logic low at SV2.

Figure 4B:
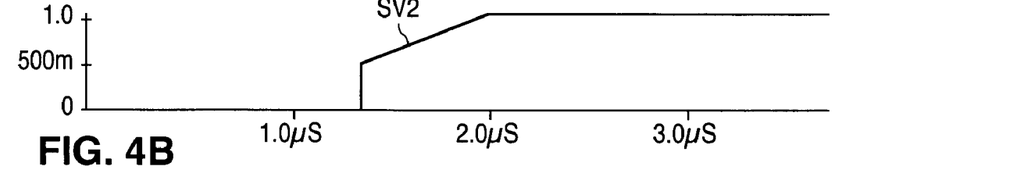

However, after the first stage output voltage SV1 has reached its peak voltage PV and begins to fall, transistor M25 begins to turn on and transistor M26 begins to turn off. As transistor M25 begins to turn on, it pulls up the second stage output voltage SV2 until this voltage becomes equal to the rising VDD voltage. After this has occurred, the second stage output voltage SV2 continues to follow the rising VDD voltage up to its final DC value (1V in FIG. 4B). Thus, as shown in FIG. 4B, the second stage output voltage SV2 transitions from a logic low to a logic high at approximately 1.3 us.

In the FIG. 2 example, the third inverter stage SG3 is implemented with a PMOS transistor M28 and an NMOS transistor M27. PMOS transistor M28 has a source connected to power supply line 214, a gate connected to receive the second stage output voltage SV2, and a drain. NMOS transistor M27 has a source connected to ground line 212, a gate connected to the gate of PMOS transistor M25 to receive the second stage output voltage SV2, and a drain connected to the drain of PMOS transistor M28. In addition, third inverter stage SG3 outputs a third stage output voltage SV3 from the drains of PMOS transistor M28 and NMOS transistor M27.

Similarly, in the FIG. 2 example, the fourth inverter stage SG4 is implemented with a PMOS transistor M30 and an NMOS transistor M29. PMOS transistor M30 has a source connected to power supply line 214, a gate connected to receive the third stage output voltage SV3, and a drain. NMOS transistor M29 has a source connected to ground line 212, a gate connected to the gate of PMOS transistor M30 to receive the third stage output voltage SV3, and a drain connected to the drain of PMOS transistor M30. In addition, fourth stage SG4 generates a fourth stage output voltage SV4 from the drains of PMOS transistor M30 and NMOS transistor M29, as the active low trigger signal TRZ.

Figure 4C:
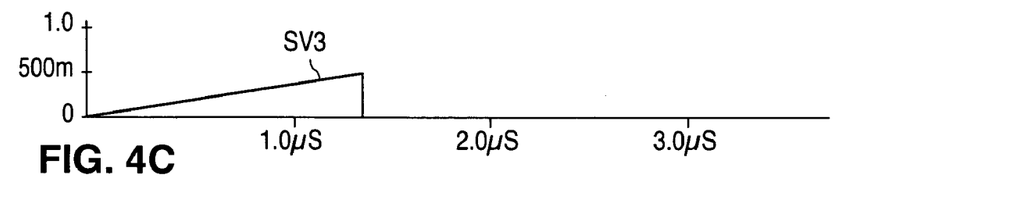
Figure 4D:
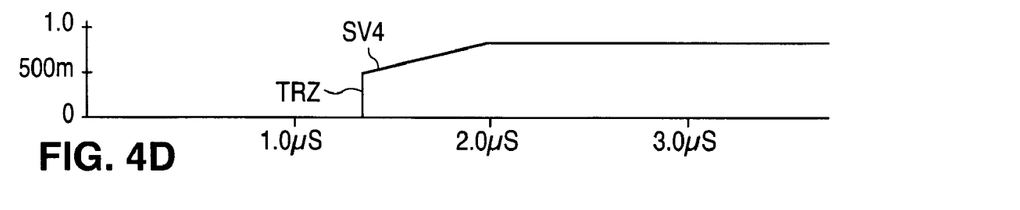

In operation, the third and fourth inverter stages SG3 and SG4 are used to square up the second stage output voltage SV2, before this signal is output as the trigger signal TRZ. Thus, as shown in FIGS. 4C and 4D, stages SG3 and SG4 essentially provide a squared up, non-inverted version of the second stage output voltage SV2.

Referring to FIGS. 2 and 4, stages SG3 and SG4 behave as follows. Because the SV2 output voltage of second inverter stage SG2 is initially low, (and will remain low until the first stage output voltage SV1 falls below the switching threshold voltage SWV), transistor M28 is initially turned on and transistor M27 is initially turned off. Thus, as the VDD voltage begins to rise from 0V to its final DC value, the magnitude of SV3, the third inverter stage output voltage, linearly rises from 0V to its peak value.

Furthermore, because the magnitude of the third stage voltage SV3 rises with the increasing VDD voltage, transistor M30 is initially turned off and transistor M29 is initially turned on. As a result, before the first stage voltage SV1 reaches the switching threshold voltage SWV, the SV4 output voltage of the fourth inverter stage SG4 is initially low.

As the third stage output voltage SV3 increases past the switching threshold voltage of the fourth inverter stage SG4, the fourth inverter stage output voltage SV4 (trigger signal TRZ) quickly rises. As shown in FIG. 4D, this occurs at the point where the first stage voltage SV1 falls below the switching threshold voltage SWV.

Referring to FIGS. 4B-4D, when the first stage output voltage SV1 falls below the reference voltage Vref, the SV2 output voltage of the second inverter stage abruptly changes state, causing the SV3 output voltage of the third inverter stage to also abruptly change state. This, in turn, causes transistor M30 to turn on and transistor M29 to turn off, which causes the SV4 (TRZ) output voltage of the fourth inverter stage to abruptly change state.

Because transistor M30 has turned on, it pulls up the fourth stage output voltage SV4 to the VDD voltage, which has not yet reached its final (peak) DC value (1V in FIG. 4D). Thus, as shown in FIG. 4D, after transistor M30 has turned on, it causes the SV4 output voltage to follow the VDD voltage until the VDD voltage reaches its final DC value (1V in FIG. 4D).

In accordance with the present invention, FIGS. 5A-5D show DC transfer function voltage diagrams that illustrate an example of the DC response of trigger circuit 200, as a function of the VDD voltage.

Figure 5A:
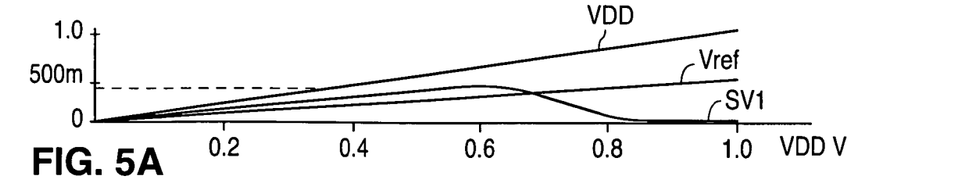
FIGS. 5A-5D are DC transfer function voltage diagrams illustrating examples of the DC response of trigger circuit 200 as a function of the VDD voltage, in accordance with the present invention.

Referring to FIG. 5A, the reference voltage Vref is a linear function (constant percentage) of the VDD voltage. Thus, as the VDD voltage is ramped up from 0V to its final DC value, the reference voltage Vref also rises from 0V to its final DC value.

The voltage ramp rate for the reference voltage Vref (measured in volts per VDD volt) must be carefully adjusted. If the reference voltage ramp rate is made too low or too high, trigger circuit 200 will not function properly. Thus, as the VDD voltage is ramped up from 0V to its final DC value, the reference voltage ramp rate must be adjusted such that the first stage output voltage SV1 initially rises and then falls, as shown in FIG. 5A. The reference voltage ramp rate can be adjusted by choosing the ratio of resistor R0 to resistor R1.

Figure 5B:
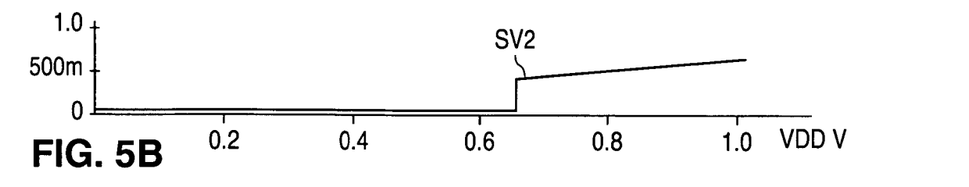

As shown in FIG. 5B, before the magnitude of the first stage output voltage SV1 falls below the switching threshold voltage SWV, the second inverter stage SG2 generates the second stage output voltage SV2 as a logic low. However, after the first stage output voltage SV1 falls below the switching threshold voltage SWV, the second stage output voltage SV2 becomes a linearly increasing ramp that represents a logic high.

Figure 5C:
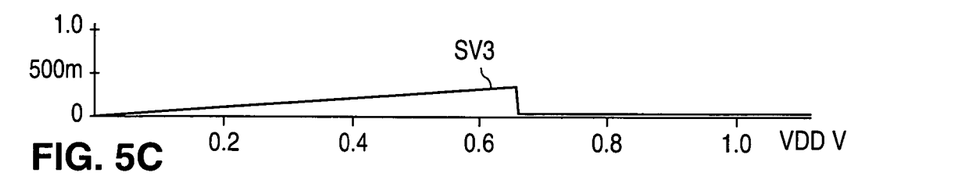

Furthermore, as shown in FIG. 5C, before the magnitude of the first stage output voltage SV1 falls below the switching threshold voltage SWV, the third inverter stage SG3 generates the third stage output voltage SV3 as a linearly increasing ramp that represents a logic high. However, after the first stage output voltage SV1 falls below the switching threshold voltage SWV, the third stage output voltage SV2 becomes a logic low.

Figure 5D:
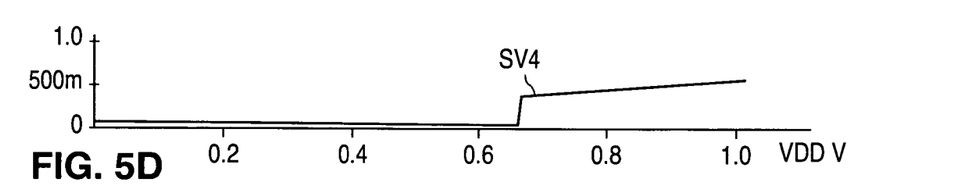

Finally, as shown in FIG. 5D, before the magnitude of the first stage output voltage SV1 falls below the switching threshold voltage SWV, the fourth inverter stage SG4 generates the fourth stage output voltage SV4 as a logic low. However, after the first stage output voltage SV1 falls below the switching threshold voltage SWV, the fourth stage output voltage SV4 becomes a linearly increasing ramp that represents a logic high.

The low-frequency time response of trigger circuit 200, as previously described above, also applies to the case where the ramp rate (volts/ns) of the VDD voltage is fast in comparison to the time constants of trigger circuit 200. Thus, trigger circuit 200 can also be employed in applications where the ramp rate of the VDD voltage is faster than the time constants of trigger circuit 200. For example, some notebook computers employ FET devices to quickly switch the VDD voltage (supplied by a battery) to chips that have been previously powered down.

Figure 6:
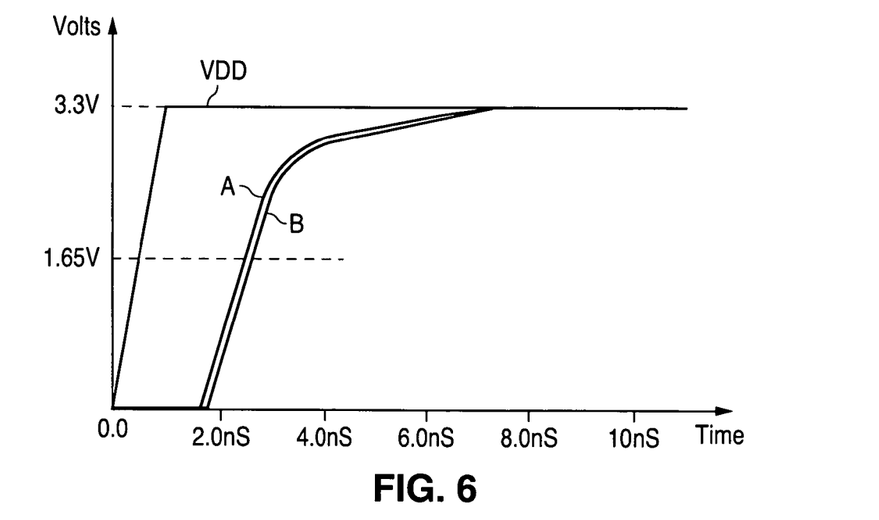
FIG. 6 is a timing diagram illustrating an example of the high-frequency time response of trigger circuit 200 in accordance with the present invention.

FIG. 6 shows a timing diagram that illustrates an example of the high-frequency response of trigger circuit 200 in accordance with the present invention. As shown in FIG. 6, the VDD voltage has an extremely fast 1ns ramp rate.

Referring to FIG. 6, two time responses of trigger circuit 200 are shown: 1) response A shows the fourth stage output voltage SV4 under fast process-voltage-temperature (PVT) conditions at 125°, and 2) response B shows the fourth stage output voltage SV4 under slow PVT conditions at 125°. As shown in FIG. 6, response A and response B are almost identical.

Again referring to the example in FIG. 6, when the 3.3V VDD voltage reaches approximately 50% of its final DC value, the duration of the fourth stage output voltage SV4 (active low trigger signal TRZ) is greater than 2 nS. A duration of this length is usually adequate for most applications. If it is not, the duration can be easily increased by decreasing the transistor sizes in the last two inverter stages SG3 and SG4 of trigger circuit 200.

Since the behavior described above is independent of the ramp rate of the VDD voltage, the active low trigger signal TRZ output by trigger circuit 200 is effectively "ratiometric" to the VDD voltage. Furthermore, although trigger circuit 200 is capable of responding to an extremely fast (1nS) rise time of the VDD voltage, in actual practice, a fast VDD rise time would only be on the order of a few microseconds.

Referring to FIG. 2, power-on reset circuit 200 can optionally include a capacitor C0 that is connected between the ground line VSS and the intermediate node N1. The reason for adding capacitor C0 is to filter out noise on the reference voltage Vref that is due to noise on the VDD line. For example, after the VDD voltage has reached its final DC value, capacitor C0 can smooth out the response of the reference voltage Vref to spikes on VDD power supply line 214.

Figure 7:
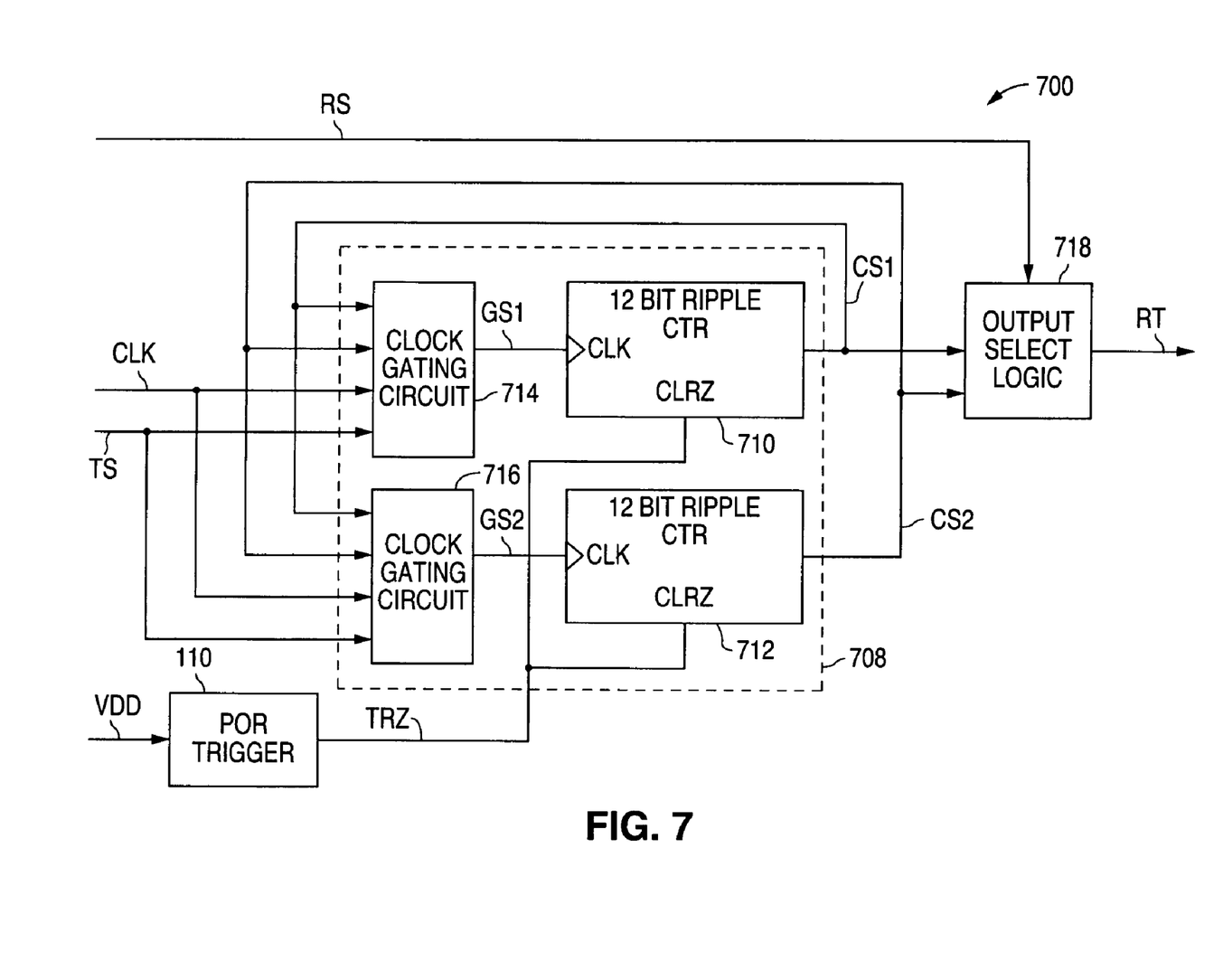
FIG. 7 is a block diagram illustrating an example of a power-on reset circuit 700 in accordance with the present invention.

FIG. 7 shows a block diagram that illustrates an example of a power-on reset circuit 700 in accordance with the present invention. Circuit 700 is similar to circuit 100 and, as a result, utilizes the same reference numerals and labels to designate the structures and signals that are common to both circuits.

As shown in FIG. 7, power-on reset circuit 700 employs counting circuit 708 in place of counter 112 in circuit 100. Counting circuit 708 includes two 12-bit counters 710 and 712, and first and second clock gating circuits 714 and 716.

Referring to FIG. 7, counter 710 has an active low clear input CLRZ that clears the counter to the starting value of its count range, in response to the active low trigger signal TRZ. Furthermore, counter 710 also includes a clock input CLK that receives a first gated clock signal GS1, and an output that generates a first counter output signal CS1, when counter 710 reaches the end of its count range.

Again referring to FIG. 7, counter 712 has an active low clear input CLRZ that clears the counter to the starting value of its count range, in response to the active low trigger signal TRZ. Furthermore, counter 712 also includes a clock input CLK that receives a second gated clock signal GS2, and an output that generates a second counter output signal CS2, when counter 712 reaches the end of its count range.

During normal (non-test) operation, counters 710 and 712 are concatenated together by clock gating circuits 714 and 716, to form a single 24-bit counter. In test mode, however, counters 710 and 712 are treated as separate 12 bit counters that can be tested much faster than a single 24-bit counter.

As shown in FIG. 7, clock gating circuit 714 has an input that receives the first counter output CS1, and an input that receives the second counter output CS2. Furthermore, clock gating circuit 714 also has an input that receives a clock signal CLK, and an input that receives a test signal TS. Clock gating circuit 714 also has an output that generates a first gated clock signal GS1.

Again referring to FIG. 7, clock gating logic circuit 716 has an input that receives the first counter output CS1, and an input that receives the second counter output CS2. Furthermore, clock gating circuit 716 also has an input that receives a clock signal CLK, and an input that receives a test signal TS. Clock gating logic circuit 716 also has an output that generates a second gated clock signal GS2.

As further shown in FIG. 7, circuit 700 includes output select logic 718. Output select logic 718 has a first input that receives the first counter output CS1, and a second input that receives the second counter output CS2. Output select logic 718 also has a third input that receives a read signal RS, and an output that generates the active high reset signal RT.

Figure 8:
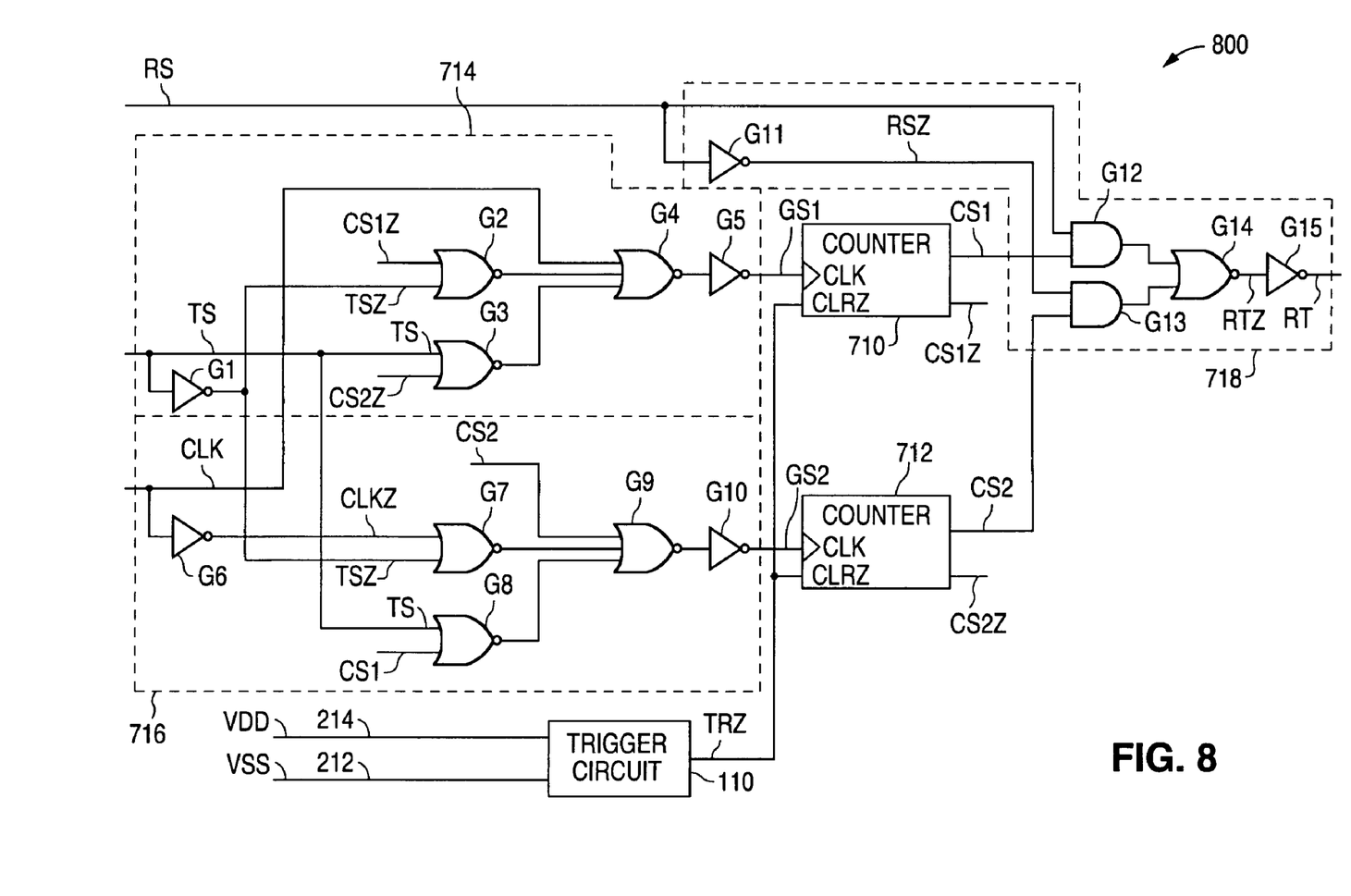
FIG. 8 is a schematic diagram illustrating a power-on reset circuit 800 in accordance with the present invention.

FIG. 8 shows a schematic diagram that illustrates a power-on reset circuit 800 in accordance with the present invention. Circuit 800 can be utilized to implement power-on reset circuit 700, and utilizes the same reference numerals to designate the elements that are common to both circuits.

As shown in the FIG. 8 example, first clock gating circuit 714 includes an inverter G1 that inverts the test signal TS to generate an inverted test signal TSZ. First clock gating circuit 714 also includes a NOR gate G2 that receives an inverted first counter output signal CSLZ, and the inverted test signal TSZ. Furthermore, first clock gating circuit 714 includes a NOR gate G3 that receives an inverted second counter signal CS2Z and the test signal TS. Additionally, first clock gating circuit 714 includes a NOR gate G4 that receives the output of NOR gate G2, the output of NOR gate G3, and the clock signal CLK. Finally, an inverter G5 inverts the output of NOR gate G4 to form the first gated signal GS1.

Similarly, second clock gating circuit 716 includes an inverter G6 that that inverts the clock signal CLK to generate an inverted clock signal CLKZ. Second clock gating circuit 716 also includes a NOR gate G7 that receives an inverted clock signal CLKZ and the inverted test signal TSZ. Furthermore, second clock gating circuit 716 includes a NOR gate G8 that receives the first counter output signal CS1 and the test signal TS. Additionally, second clock gating circuit 716 includes a NOR gate G9 that receives the output of NOR gate G7, the output of NOR gate G8, and the second counter output CS2. Finally, an inverter G10 inverts the output of NOR gate G9 to form the second gated signal GS2.

As further shown in the FIG. 8 example, output select logic 718 includes an inverter G11 that inverts the read signal RS to form an inverted read signal RSZ. Output select logic 718 also includes an AND gate G12 that receives the read signal RS and the first counter output signal CS1. Furthermore, output select logic 718 includes an AND gate G13 that receives the inverted read signal RSZ and the second counter output signal CS2.

In addition, output select logic 718 also includes a NOR gate G14 that receives the output of AND gate G12 and the output of AND gate G13 to output an active low reset signal RTZ. Furthermore, an inverter G15 inverts the active low reset signal RTZ to output the active high reset signal RT.

Trigger circuit 800 provides two operating modes: a normal operating mode and a test operating mode. In both modes, the first and second ripple counters 710 and 712 are cleared by the active low trigger signal TRZ.

As shown in FIG. 8, the trigger signal TRZ is generated by trigger circuit 110. As previously described, the TRZ signal remains active low during most of the time interval during which the VDD voltage is ramping up from 0V to its final DC value. This behavior ensures that first and second counters 710 and 712 will have a sufficiently high VDD voltage to operate properly, and that they will both be initially cleared. Of course, while the TRZ signal is low, any clock pulses received by counters 710 and 712 will be ignored, and both counters will remain in their cleared state.

In normal operating mode (TS=0), the two 12-bit ripple counters 710 and 712 are concatenated to form a single 24-bit ripple counter that is driven by the gated clock signal GS1. Following removal of the active low trigger signal TRZ, this 24-bit ripple counter provides the required crystal warm-up delay by counting the pulses of the clock signal CLK.

Furthermore, as the VDD voltage is rising from 0V to its final DC value, the 24-bit ripple counter also provides hysteresis to guard against noise on the VDD power supply line. For example, if there is considerable noise on the VDD power supply line while the VDD voltage is rising, the active low trigger signal TRZ could go from the inactive (high) state to the active (low) state, and then return to the inactive (high) state again. If the VDD power supply line is extremely noisy, this behavior could occur multiple times.

If this behavior does occur one or more times, the 24-bit ripple counter will be cleared to the zero state one or more times, and the 24-bit ripple counter will begin to count up from zero one or more times. This behavior essentially provides a form of hysteresis that acts as a noise filter while the VDD voltage is rising. (The classical method of providing hysteresis, which is to employ a Schmitt trigger, cannot be used while the VDD voltage is rising because the Schmitt trigger would not have a "valid" VDD voltage required for proper circuit operation.)

In the present example, the logic equation for the first gated clock signal GS1 is: GS1=CLK+CS1*TS+CS2*TSZ, and the logic equation for the second gated clock signal GS2 is: GS2=CS2+CLK*TS+CS1Z*TSZ. (The operator "+" represents a logical OR, while the operator "*" represents a logical AND.) As shown by the logic equations for the first and second gated clock signals, GS1 and GS2 both depend on the state of the test signal TS and its logical compliment TSZ.

By examining the logic equations for the first and second gated clock signals GS1 and GS2, it can be seen that during test mode, when the test signal TS is active (TS=1 and TSZ=0), counter 710 and counter 712 are not concatenated together. Instead, counter 710 and counter 712 are broken apart and each of them is simultaneously clocked by the same clock signal CLK.

In addition, the first counter clock signal GS1 will be frozen in the logic high state after the last stage of first counter 710 has gone from low to high. This occurs after the trigger signal TRZ has become inactive and 2048 pulses of the clock signal CLK have been counted by first counter 710. Freezing the first counter clock signal GS1 in the logic high state causes counter 710 to stop counting.

Similarly, the second counter clock signal GS2 will be frozen in the logic high state after the last stage of second counter 712 has gone from low to high. This occurs after the trigger signal TRZ has become inactive and 2048 pulses of the clock signal CLK have been counted by second counter 712. Freezing the second counter clock signal GS2 in the logic high state causes counter 712 to stop counting.

It is important to note that first and second 12-bit counters 710 and 712 can be tested using only $2^{11}$=2048 pulses of the clock signal CLK. This compares very favorably with the $2^{23}$=8,388,608 clock pulses that are required to test a 24-bit counter. The net result is that the counter test time is decreased by a factor of 4096, a significant amount.

By careful examination of the logic equations for GS1 and GS2, it can be seen that in normal operating mode, when the test signal TS is inactive (TS=0 and TSZ=1), first 12-bit ripple counter 710 and second 12-bit ripple counter 712 are concatenated together to form a single 24-bit ripple counter. This occurs because CS1Z, the complemented output from the last stage of first counter 710, is used to clock counter 712 (via gates G8, G9, and G10).

Furthermore, as shown by the logic equation for GS2, in normal operating mode (TS=0 and TSZ=1) the 24-bit ripple counter clock signal will be frozen in the logic high state after the last stage of second ripple counter 712 has gone from low to high. This occurs after the active low trigger signal TRZ has become inactive high (TSZ=1 and TS=0), and $2^{23}$=8,388,608 pulses of the clock signal CLK have been counted by the 24-bit ripple counter. Freezing the 24-bit ripple counter clock signal in the logic high state causes the 24-bit ripple counter to stop counting.

The time required for the last stage of the 24-bit ripple counter to go from low to high provides the crystal warm-up delay. For example, if the frequency of the clock signal CLK is 25 Mhz, the crystal warm-up delay will be equal to $2^{23}$/25 Mhz=0.336 seconds. This provides an adequate warm-up delay for most crystals. In the unlikely event that a longer warm-up delay is needed, extra flipflop stage(s) can be added to first counter 710 and second counter 712. Of course, if a shorter warm-up delay is needed, flipflop stages can be removed from first counter 710 and second counter 712.

In normal operating mode, the 24-bit ripple counter stops counting after the crystal warm-up delay (power-on reset interval) has expired, effectively reducing the AC switching power ($CV^2F$ power) in circuit 800 to zero. Minimizing the AC switching power is especially important in low power (i.e. battery-powered) applications.

Referring to FIG. 8, the logic equation for RT, the active high output of reset circuit 800, is: RT=RS*CS1+RSZ*CS2. By examining this equation, it can be seen that if the read signal RS is high (RS=1 and RSZ=0), the last stage of first counter 710 will appear on RT. Conversely, if the read signal RS is low (RS=0 and RSZ=1), the last stage of second counter 712 will appear on RT.

In normal operating mode (test signal TS=0), the read signal RS must be driven low so that the last stage of the 24-bit ripple counter (output signal CS2 in FIG. 8) can drive the reset signal RT. As previously described, the reset signal RT will remain inactive low until the last stage of the 24-bit ripple counter goes from low to high. This logic change will occur after $2^{23}$=8,388,608 pulses of the clock signal CLK have been counted by the 24-bit ripple counter.

In test mode (test signal TS=1), the read signal RS can be driven high or low. Thus, if RS is driven high, the CS1 output of first counter 710 will drive the RT output, allowing counter 710 to be tested. Conversely, if RS is driven low, the CS2 output of second counter 712 will drive the RT output, allowing counter 712 to be tested. Counters 710 and 712 can be implemented as conventional ripple counters, employing rising edge triggered flipflops or trailing edge triggered flipflops.

In summary, a power-on reset circuit has been described that eliminates the need for several components, including: 1) the external RC components needed to generate a crystal warm-up delay; 2) a reset package pin to which the external RC components would be connected; and 3) an internal or external Schmitt trigger circuit that would be needed to speed up the extremely slow rise time created by external RC components.

In addition, the power-on reset circuit includes a crystal warm-up delay counter that can provide a crystal warm-up delay of arbitrary duration. An embodiment of the power-on reset circuit allows a 24-bit warm-up delay counter to be partitioned into two 12 bit counters for test purposes, resulting in significantly less test time.

Furthermore, trigger circuit 110 can tolerate an extremely wide range of power supply voltages, ranging from below 1V to above 5V. In addition, trigger circuit 110 is fully ratiometric to the VDD supply voltage which, in turn, allows trigger circuit 110 to tolerate any VDD voltage rise time, ranging from zero to infinity.

It should be understood that the above descriptions are examples of the present invention, and that various alternatives of the invention described herein may be employed in practicing the invention. Thus, it is intended that the following claims define the scope of the invention, and that the structures and methods within the scope of these claims and their equivalents be covered thereby.

What is claimed is:

1. A power-on reset circuit comprising:
    a trigger circuit having:
        a first resistor connected to a node;
        a second resistor connected to the node, a first voltage being output at the node;
        a third resistor; and
        a transistor having a source, a gate connected to receive the first voltage, and a drain connected to the third resistor, a second voltage being output at the drain of the transistor; and
    a counter connected to the trigger circuit, the counter including:
        a first counting circuit having a first input connected to the trigger circuit, a second input connected to receive a first gated signal, and an output to generate a first count signal;
        a second counting circuit having a first input connected to the trigger circuit, a second input connected to receive a second gated signal, and an output to generate a second count signal;
        a first gate circuit having a first input to receive the first count signal, a second input to receive the second count signal, and a third input to receive a clock signal, and an output to generate the first gated signal; and
        a second gate circuit having a first input to receive the first count signal, a second input to receive the second count signal, and a third input to receive the clock signal, and an output to generate the second gated signal.

2. The power-on reset circuit of claim 1 wherein the first gate circuit receives a test signal.

3. The power-on reset circuit of claim 2 wherein the first gate circuit receives an inverted test signal.

4. The power-on reset circuit of claim 1 wherein the first gated signal is the clock signal logically ORed to a first value and a second value, the first value being the logical AND of the first counter signal and the test signal, the second value being the logical AND of the second counter signal and the inverted test signal.

5. The power-on reset circuit of claim 4 wherein the first and second counting circuits begins counting when a signal from the trigger circuit indicates that a first delay period has expired.

6. The power-on reset circuit of claim 5 wherein the first and second counting circuits stop counting after a second delay period has expired.

7. The power-on reset circuit of claim 6 and further comprising an output logic circuit that generates a reset signal when a read signal is active, and the first and second count signals indicate that the second delay has expired.

8. The power-on reset circuit of claim 1 wherein the counter begins counting when a signal from the trigger circuit indicates that a first delay period has expired.

9. The power-on reset circuit of claim 8 wherein the counter stops counting after a second delay period has expired.

10. The power-on reset circuit of claim 9 and further comprising an output logic circuit that generates a reset signal when a read signal is active, and the counter indicates that the second delay has expired.

11. A power-on reset circuit comprising:
    a trigger circuit that outputs a trigger signal a predetermined time after a supply voltage ramps up from ground; and
    a counter connected to the trigger circuit, the counter including:
        a first counting circuit having a first input connected to the trigger circuit to receive the trigger signal, a second input connected to receive a first gated signal, and an output to generate a first count signal;
        a second counting circuit having a first input connected to the trigger circuit to receive the trigger signal, a second input connected to receive a second gated signal, and an output to generate a second count signal;
        a first gate circuit having a first input to receive the first count signal, a second input to receive the second count signal, and a third input to receive a clock signal, and an output to generate the first gated signal; and
        a second gate circuit having a first input to receive the first count signal, a second input to receive the second count signal, and a third input to receive the clock signal, and an output to generate the second gated signal.

12. The power-on reset circuit of claim 11 wherein the trigger circuit includes:
    a first resistive element connected to a node;
    a second resistive element connected to the node, a first voltage being output at the node;
    a third resistive element; and
    a transistor having a source, a gate connected to receive the first voltage, and a drain connected to the third resistive element, a second voltage being output at the drain of the transistor.

13. The power-on reset circuit of claim 11 wherein the first gate circuit receives a test signal and an inverted test signal.

14. The power-on reset circuit of claim 13 wherein the first gated signal is the clock signal logically ORed to a first value and a second value, the first value being the logical AND of the first counter signal and the test signal, the second value being the logical AND of the second counter signal and the inverted test signal.

* * * * *

UNITED STATES PATENT AND TRADEMARK OFFICE
CERTIFICATE OF CORRECTION

PATENT NO.         : 7,518,419 B1
APPLICATION NO.    : 11/639497
DATED              : April 14, 2009
INVENTOR(S)        : Ronald Pasqualini

It is certified that error appears in the above-identified patent and that said Letters Patent is hereby corrected as shown below:

Column 7,
    Line 8, delete "Ins" and replace with --1ns--.

Column 8,
    Line 30, delete "CSLZ" and replace with --CS1Z--.

Signed and Sealed this

Twenty-sixth Day of May, 2009

JOHN DOLL
*Acting Director of the United States Patent and Trademark Office*